(12) United States Patent
Kitamura

(10) Patent No.: US 8,892,615 B2
(45) Date of Patent: Nov. 18, 2014

(54) ARITHMETIC OPERATION CIRCUIT AND METHOD OF CONVERTING BINARY NUMBER

(75) Inventor: Kenichi Kitamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 374 days.

(21) Appl. No.: 13/410,652

(22) Filed: Mar. 2, 2012

(65) Prior Publication Data

US 2012/0254271 A1 Oct. 4, 2012

(30) Foreign Application Priority Data

Mar. 29, 2011 (JP) .................................. 2011-073673

(51) Int. Cl.
*G06F 5/00* (2006.01)
*G06F 5/01* (2006.01)
*G06F 7/523* (2006.01)
*G06F 7/50* (2006.01)

(52) U.S. Cl.
CPC *G06F 5/01* (2013.01); *G06F 7/523* (2013.01); *G06F 7/50* (2013.01)
USPC ........................................................ 708/204

(58) Field of Classification Search
None
See application file for complete search history.

(56) References Cited

U.S. PATENT DOCUMENTS

| 4,069,478 A * | 1/1978 | Miller .............................. 341/84 |
| 4,672,360 A * | 6/1987 | Bradley et al. ................. 341/104 |
| 5,251,321 A * | 10/1993 | Boothroyd et al. ............. 341/84 |
| 2012/0254271 A1* | 10/2012 | Kitamura ...................... 708/209 |
| 2013/0246490 A1* | 9/2013 | Lee et al. ...................... 708/204 |

FOREIGN PATENT DOCUMENTS

| JP | 57-061333 | 4/1982 |
| JP | 59-168543 | 9/1984 |
| JP | 5-29949 | 2/1993 |
| JP | 10-271008 | 10/1998 |
| JP | 2000-200174 | 7/2000 |
| JP | 2008-131336 | 6/2008 |

OTHER PUBLICATIONS

Japanese Office Action dated Sep. 2, 2014 in corresponding Japanese Patent Application No. 2011-073673.

* cited by examiner

*Primary Examiner* — David H Malzahn
(74) *Attorney, Agent, or Firm* — Staas & Halsey LLP

(57) ABSTRACT

An arithmetic operation circuit includes: an extractor circuit that extracts one or a plurality of bits consecutive from a most significant bit or from a least significant bit of a binary number; a sum register that stores an X-adic sum, where X is an integer more than two; and an update circuit that updates the stored X-adic sum with a value obtained by adding a first X-adic number to be cyclically multiplied by a certain coefficient to the X-adic sum in accordance with the extracted one or plurality of bits.

15 Claims, 15 Drawing Sheets

US 8,892,615 B2

ARITHMETIC OPERATION CIRCUIT AND METHOD OF CONVERTING BINARY NUMBER

CROSS-REFERENCE TO RELATED APPLICATION(S)

This application is based upon and claims the benefit of priority of the prior Japanese Patent Application No. 2011-73673, filed on Mar. 29, 2011, the entire contents of which are incorporated herein by reference.

FIELD

The embodiments discussed herein are related to an arithmetic operation circuit and a method of converting a binary number.

BACKGROUND

In a computer, on-state and off-state of a transistor may be represented by data, and digital data may be indicated as a binary number. Data handled by a person may be indicated as a decimal number. A decimal number is converted into a binary number and vice versa between input and output data and data processed within the computer.

Related art is disclosed in Japanese Laid-open Patent Publication Nos. 57-061333, 10-271008, 59-168543 or 2000-200174.

SUMMARY

According to one aspect of the embodiments, an arithmetic operation circuit includes: an extractor circuit that extracts one or a plurality of bits consecutive from a most significant bit or from a least significant bit of a binary number; a sum register that stores an X-adic sum, where X is an integer more than two; and an update circuit that updates the stored X-adic sum with a value obtained by adding a first X-adic number to be cyclically multiplied by a certain coefficient to the X-adic sum in accordance with the extracted one or plurality of bits.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As conditions for carry addition are different between a binary number and a decimal number, each of digits of a binary number is converted into a decimal number according to a binary coded decimal notation of data. Each of bits of a binary number is converted into a decimal number and the decimal numbers after the conversion are added up in consideration of the digit order. A process such that every bit of a binary number to be converted is taken out in descending order from an upper bit and that the taken-out bit is added to a value obtained by doubling the added-up decimal numbers may be repeated.

A repeated process may cause extended processing time as a bit width of input data increases. Thus, a plurality of bits may be processed contemporaneously. For example, data may be processed in parallel depending upon a combination of input data provided to an adder and a multiple generator circuit.

A path including an adder circuit having lots of logic gate stages may form a critical path (a path having a most significant delay which affects an operation frequency) for an arithmetic operation, and may cause a longer delay.

Figure 1:
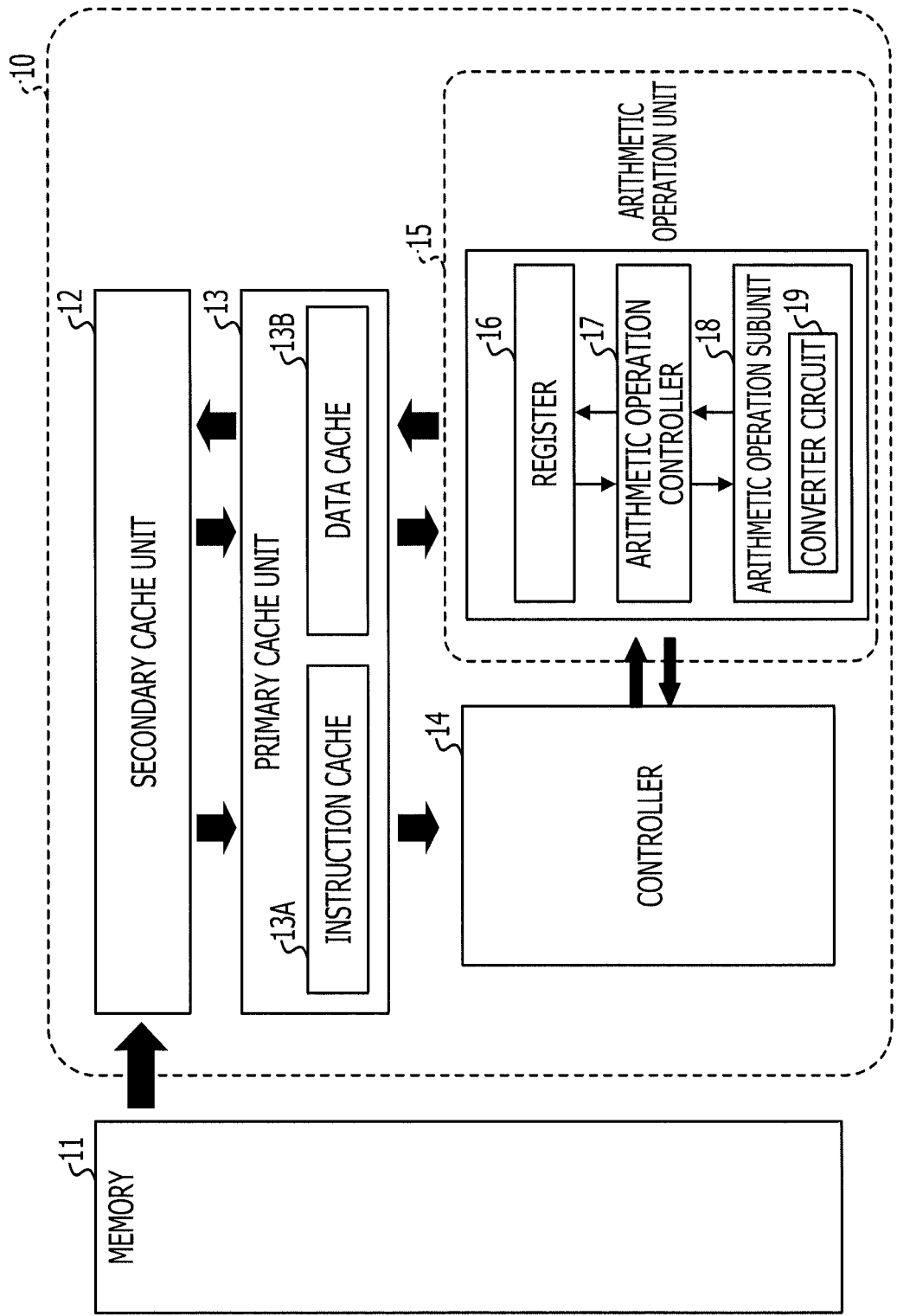
FIG. 1 illustrates an exemplary computer system.

FIG. 1 illustrates an exemplary computer system. The computer system illustrated in FIG. 1 includes a processor 10 as an arithmetic operation device and a memory 11 as a main storage. The processor 10 includes a secondary cache unit 12, a primary cache unit 13, a controller 14 and an arithmetic operation unit 15. The primary cache unit 13 includes an instruction cache 13A and a data cache 13B. The arithmetic operation unit 15 includes a register 16, an arithmetic operation controller 17 and an arithmetic operation subunit 18. The arithmetic operation subunit 18 includes a converter circuit 19. An interface between a functional block and another functional block each illustrated as a box in FIG. 1 indicates a functional interface, and may differ from separation in physical positions, separation in electric signals or separation in control logic, etc. A functional block may be one hardware module which is physically separate from another block to a certain extent. The functional block may represent one function in a hardware module physically integrated with another block. The functional block may be one module which is logically separate from another block to a certain extent. The functional block may represent one function in a module logically integrated with another block.

The processor 10 is provided with the primary cache unit 13 and the secondary cache unit 12 both forming a multi-layered cache memory. The secondary cache memory 12 which is accessed faster than the main memory, e.g., the memory 11 is provided between the primary cache unit 13 and the main memory. Thus, if a cache miss occurs in the primary cache unit 13, the main memory may be accessed less frequently so that cache miss penalty may be reduced.

The controller 14 issues an instruction fetch address and an instruction fetch request to a primary instruction cache 13A, and fetches an instruction corresponding to the instruction fetch address. The controller 14 decodes the fetched instruction, controls the arithmetic operation unit 15 based on a decoded result and carries out the fetched instruction. The arithmetic operation controller 17 is controlled by the controller 14, provides the arithmetic operation subunit 18 with data to be calculated from the register 16, or stores the calculated data in the register 16. The arithmetic operation controller 17 specifies a type of arithmetic operations which includes addition, subtraction, multiplication, division or the like and are carried out by the arithmetic operation subunit 18. The arithmetic operation controller 17 specifies an address to be accessed, and carries out a loading instruction or a storing instruction on the primary cache unit 13. Data read from the specified address by the loading instructions is stored in the specified register 16. Data in the specified register 16 is written into the specified address according to the storing instructions.

The converter circuit 19 included in the arithmetic operation subunit 18 may convert a binary number into an X-adic number (X is an integer and not smaller than three). As decimal numbers are used by persons, the converter circuit 19 may be a circuit which converts a binary number into a decimal number. When the converted data is an X-adic number, the converter circuit 19 may be a circuit which converts a binary number into the X-adic number. Any method for notation of an X-adic number is allowable. For example, a binary coded decimal (BCD) notation may be used for decimal numbers, and another notation may be used.

Figure 2:
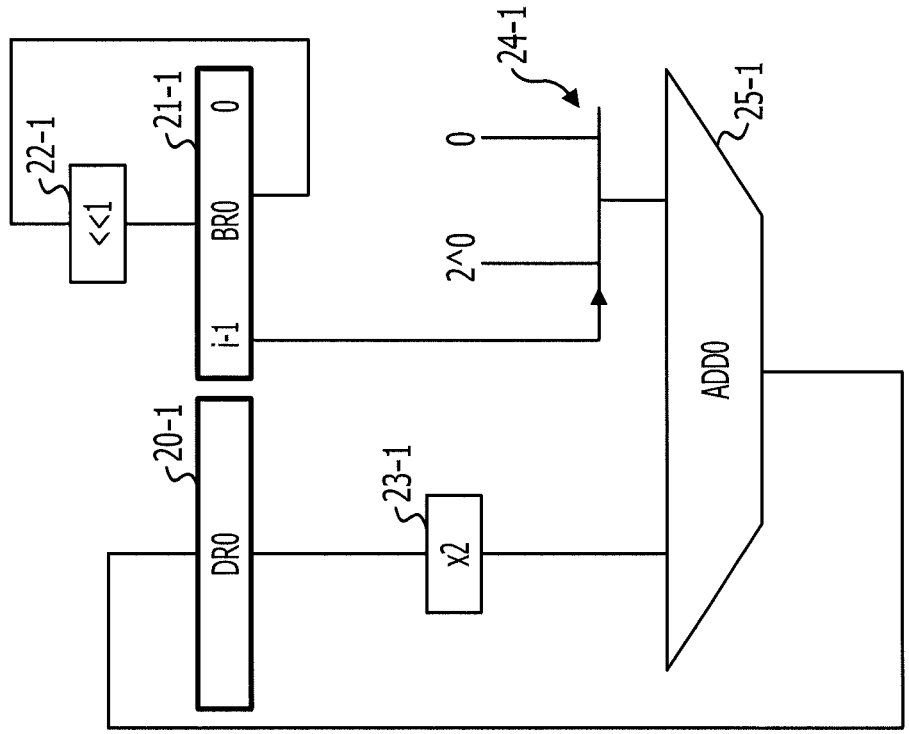
FIG. 2 illustrates an exemplary converter circuit.
Figure 2:
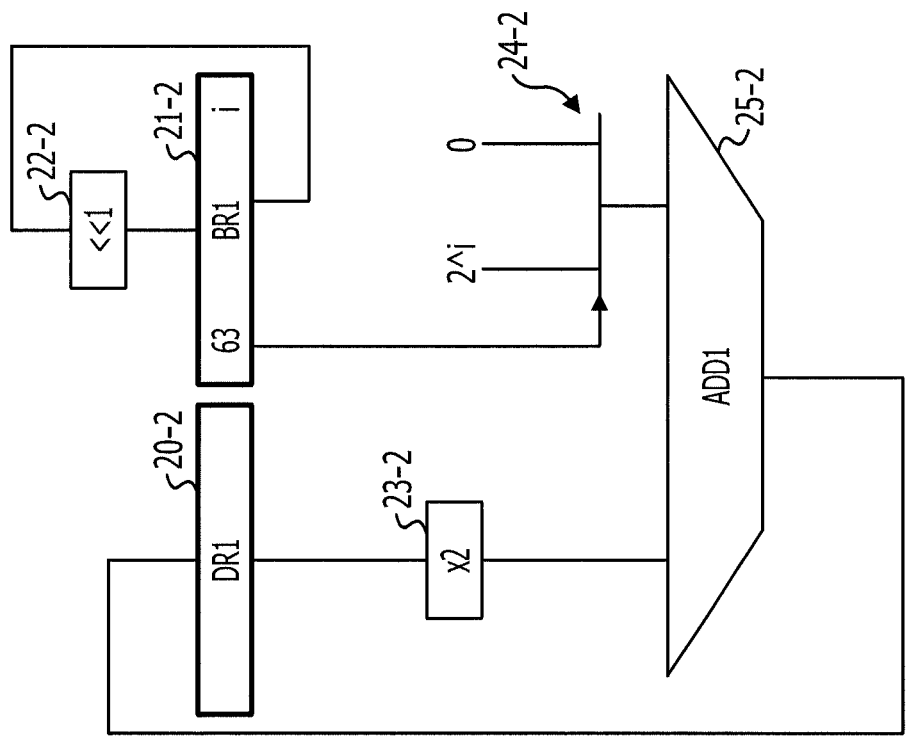

FIG. 2 illustrates an exemplary converter circuit. The converter circuit illustrated in FIG. 2 may be the converter circuit 19 illustrated in FIG. 1. The converter circuit illustrated in FIG. 2 may include a multiple generator circuit which doubles a resultant sum on a path of an adder circuit. Two sets of converters having substantially the same or similar constitutions are provided. Upper bits (left sided in FIG. 2) and lower bits (right sided in FIG. 2) of the binary number to be converted are converted in parallel.

The converter circuit illustrated in FIG. 2 includes a data register (DR0) 20-1, a binary data register (BR0) 21-1, a bit shift circuit 22-1, a multiple generator circuit 23-1, a selector circuit 24-1 and an adder circuit (ADD0) 25-1. The circuits and registers convert lower i bits of 0th to (i−1)th bits in a binary number into a decimal number. The converter circuit includes a data register (DR1) 20-2, a binary data register (BR1) 21-2, a bit shift circuit 22-2, a multiple generator circuit 23-2, a selector circuit 24-2 and an adder circuit (ADD1) 25-2. The circuits and registers convert upper (63-(i−1)) bits of (i)th to 63rd bits in a binary number into a decimal number.

The selector circuit 24-1 of the right sided converter illustrated in FIG. 2 which converts lower i bits into a decimal number is provided with a most significant ((i−1)th) bit of a binary number in the binary data register 21-1 as a selection signal. The selector circuit 24-1 is provided with decimal 0 and 1 (=$2^0$) as input data to be selected. The selector circuit 24-1 outputs 0 and 1 upon the selection signal being 0 and 1, respectively. The adder circuit 25-1 adds a decimal number obtained by doubling a decimal number in the data register 20-1 by the multiple generator circuit 23-1 to the decimal number 0 or 1 (=$2^0$) from the selector circuit 24-1. Decimal 0 is stored in the data register 20-1 initially. The adder circuit 25-1 stores a resultant sum, a decimal number, in the data register 20-1.

After the above operations are carried out, the binary number stored in the binary data register 21-1 is shifted one bit left by the bit shift circuit 22-1. A bit used to be leftmost before the shift to the left, e.g., the most significant (i−1)th bit is discarded. After the binary number is shifted one bit left, the selector circuit 24-1 is provided with the most significant bit as a selection signal, and the above operations may be repeated. The above operations are carried out on all bits of the binary number, so that the binary number is converted into a decimal number and a result of the conversion is stored in the data register 20-1. The left sided converter illustrated in FIG. 2 which converts the upper (63-(i−1)) bits into a decimal number similarly operates. As the binary number of the upper bits from the (i)th bit to the most significant bit is converted into a decimal number, two inputs to the selector circuit 24-2 may be 0 and $2^i$.

As the adder circuit includes lots of stages, a path including the adder circuit may be a critical path for an arithmetic operation process. As the paths of the adder circuits of the converter circuits illustrated in FIG. 2 include the multiple generator circuits 23-1 and 23-2, a delay on the critical path may increase.

Figure 3:
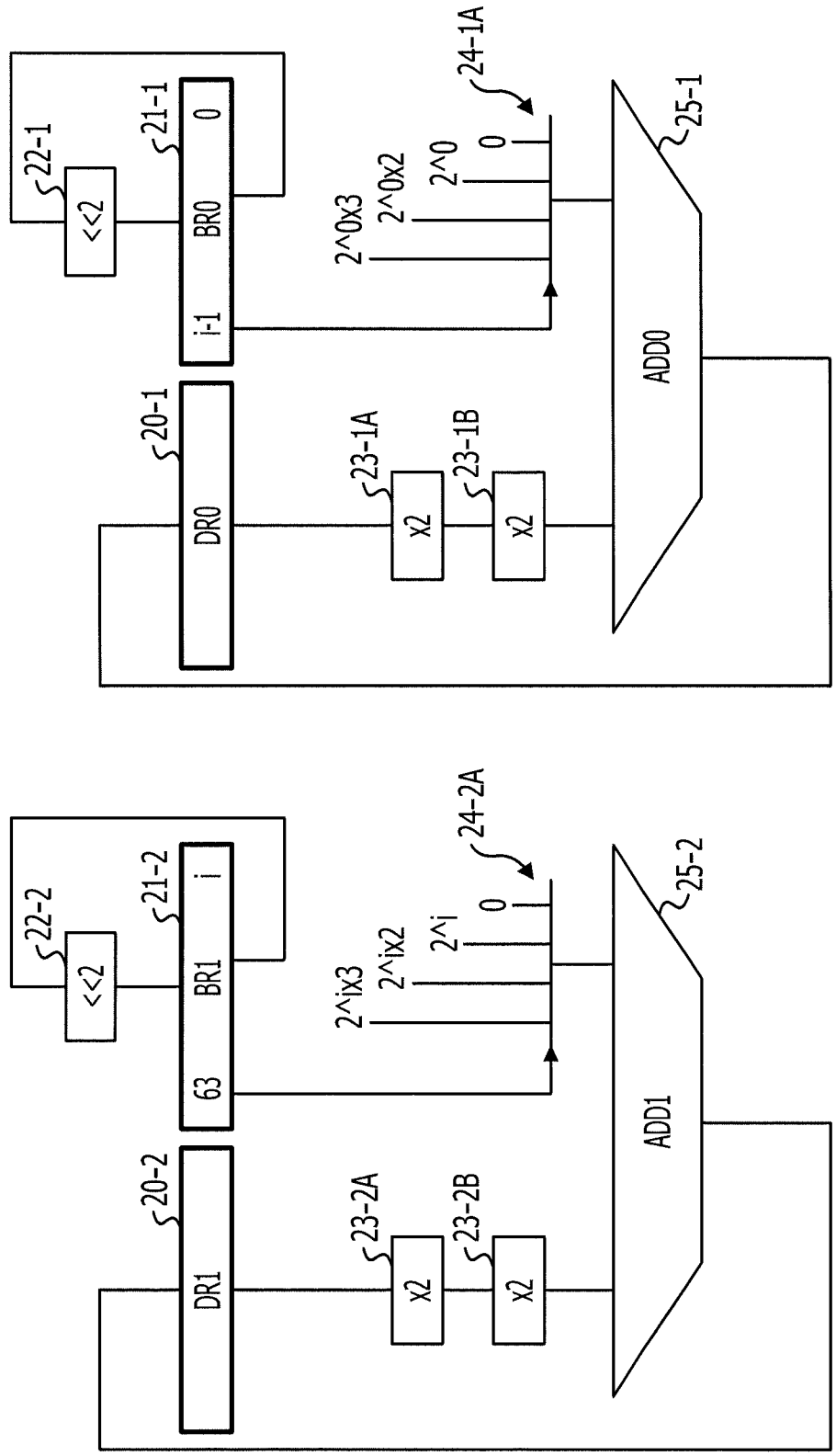
FIG. 3 illustrates an exemplary converter circuit.

FIG. 3 illustrates an exemplary converter circuit. The converter circuit illustrated in FIG. 3 may be the converter circuit 19 illustrated in FIG. 1. The converter circuit illustrated in FIG. 3 may process in units of two bits in parallel, for example, parallel data process where two bits together are processed in one cycle. Elements illustrated in FIG. 3 which are substantially the same as or similar to the elements illustrated in FIG. 2 is given the same reference numeral as in FIG. 2, and the explanation may be omitted or reduced.

The selector circuits 24-1 and 24-2 illustrated in FIG. 2 may be replaced with selector circuits 24-1A and 24-2A in FIG. 3. The multiple generator circuit 23-1 illustrated in FIG. 2 may be replaced with multiple generator circuits 23-1A and 23-1B. The multiple generator circuit 23-2 may be replaced with multiple generator circuits 23-2A and 23-2B.

The selector circuit 24-1A of the right sided converter illustrated in FIG. 3 which converts lower i bits into a decimal number receives decimal numbers 0, 1 (=$2^0$), 2 (=$2\times2^0$) and 3 (=$3\times2^0$). The selector circuit 24-1A is provided with most significant two bits ((i−1)th and (i−2)th bits) of a binary number to be converted in the binary data register 21-1 as a two-bit selection signal. The selector circuit 24-1A outputs one of decimal values 0, 1, 2 and 3 in accordance with the two-bit selection signal. The adder circuit 25-1 adds a decimal number obtained by quadrupling a decimal number in the data register 20-1 by the multiple generator circuits 23-1A and 23-1B to the decimal number of one of 0, 1, 2 and 3 output by the selector circuit 24-1A. The adder circuit 25-1 stores a resultant sum, a decimal number, in the data register 20-1.

After the above process, the binary number in the binary data register 21-1 is shifted two bits left by the bit shift circuit 22-1. After the binary number is shifted two bits left, the selector circuit 24-1A is provided with most significant two bits as a selection signal, and a process similar to the above may be repeated. The above process is carried out on all bits of the binary number, so that the binary number is converted into a decimal number and a result of the conversion is stored in the data register 20-1. The left sided converter illustrated in FIG. 3 which converts the upper (63-(i−1)) bits into a decimal number may carry out a substantially similar process. As the upper (i)th to most significant bits have been converted into a decimal number, the two inputs to the selector circuit 24-2A may be 0, $2^i$, $2\times2^i$ and $3\times2^i$.

The paths of the adder circuits of the converter circuits illustrated in FIG. 3 each include two multiple generator circuits (multiple generator circuits 23-1A and 23-1B; 23-2A and 23-2B) which each double a resultant sum. Thus, a delay on the critical path may be greater than that in the converter circuit illustrated in FIG. 2.

Figure 4:
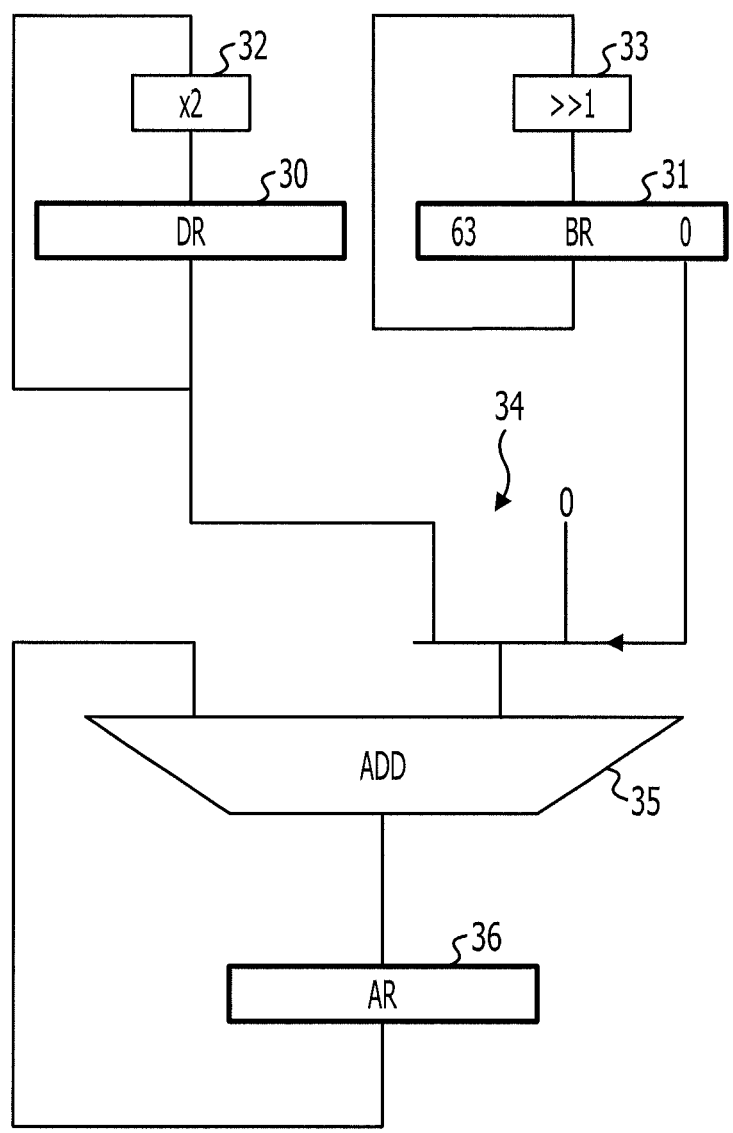
FIG. 4 illustrates an exemplary converter circuit.

FIG. 4 illustrates an exemplary converter circuit. The converter circuit illustrated in FIG. 4 converts a binary number into a decimal number. The converter circuit includes a data register (DR) 30, a binary data register (BR) 31, a multiple generator circuit 32, a bit shift circuit 33, a selector circuit 34, an adder circuit (ADD) 35 and an accumulator register (AR) 36. Although the binary data register 31 has a width of 64 bits in FIG. 4, any bit width is allowable.

For example, an extractor circuit may include the binary data register 31, the bit shift circuit 33 and a signal line extended from the binary data register 31 to the selector circuit 34. A binary number is stored in the binary data register 31. The bit shift circuit 33 shifts the binary number in the binary data register 31, e.g., right, or left. For example, one or a plurality of consecutive bits from the least or the most significant bit of the binary data register 31, for example, the least significant bit is read through the signal line extended from the binary data register 31 to the selector circuit 34. The extractor circuit extracts one or a plurality of consecutive bits from the least or most significant bit of the binary number in the binary data register 31 after every shift.

A decimal number to be cyclically multiplied by a certain coefficient is stored in the data register 30. The multiple generator circuit 32 multiplies an output of the data register 30 by a certain coefficient, e.g., two, and provides the data register 30 with a product of the multiplication. The selector circuit 34 selects one of a plurality of decimal numbers including the decimal number to be multiplied by the coefficient from the data register 30 and zero in accordance with a value of one or a plurality of bits extracted by the extractor circuit, for example, one of bits. For example, the selector circuit 34 is provided with two inputs which are zero and the number to be multiplied by the coefficient. The selector circuit 34 outputs one of zero and the number to be multiplied by the coefficient in accordance with the value of the one bit extracted by the extractor circuit.

An update circuit may include the adder circuit 35 and the accumulator register 36. A decimal sum is stored in the accumulator register 36. An initial value of the decimal sum in the accumulator register 36 may be zero. The adder circuit 35 adds the number selected by the selector circuit 34 to the decimal sum from the accumulator register 36 so as to update the decimal sum in the accumulator register 36. For example, the adder circuit 35 writes a decimal sum corresponding to a result of addition into the accumulator register 36. The update circuit updates the decimal sum in the accumulator register 36 with the value obtained by adding the decimal number to be cyclically multiplied by the coefficient to the decimal sum in accordance with a value of one or a plurality) of extracted bits, for example, one of the extracted bits. For example, if the extracted bit is "1", the adder circuit 35 adds the decimal number to be cyclically doubled to the decimal sum. If the extracted bit is "0", the adder circuit 35 adds "0" to the decimal sum.

The multiple generator circuit 32 may double the decimal number in the data register 30 while the adder circuit 35 performs addition in a certain cycle. The data in the accumulator register 36 is updated in that cycle, and the binary number in the binary data register 31 is updated in preparation for a next cycle. An output of the multiple generator circuit 32 may update the decimal number in the data register 30 in preparation for the next cycle substantially at the same time.

A decimal number output by the selector circuit 34 in each cycle may correspond to a value of a decimal number obtained by converting a focused bit, e.g., an extracted bit of a binary number in the binary data register 31. Every bit starting from the least significant bit of the binary number n the binary data register 31 is consecutively converted into a decimal number and is added to the decimal sum in the accumulator register 36. After the above operation is completed for all bits of the binary number in the binary data register 31, a decimal number obtained by converting the binary number may be obtained from the accumulator register 36.

The converter circuit illustrated in FIG. 4 may not include a multiple generator circuit which doubles a resultant sum on a path from the output of the data register 30 or of the binary data register 31 to the input of the accumulator register 36 including the adder circuit 35. The multiple generator circuit 32 provided on the input side of the data register 30 performs a doubling operation while the adder circuit 35 performs addition in a certain cycle. A period of time for an arithmetic operation of the adder circuit 35 may include a period of time for an arithmetic operation of the multiple generator circuit 32. A delay on a critical path including the adder circuit 35 illustrated in FIG. 4 may be small. The selector circuit 34 is provided on the critical path from the output of the data register 30 to the input of the accumulator register 36 in addition to the adder circuit 35. The number of logic gate stages between the input and output of the selector circuit 34 may be smaller than that between the input and output of the multiple generator circuit.

Figure 5:
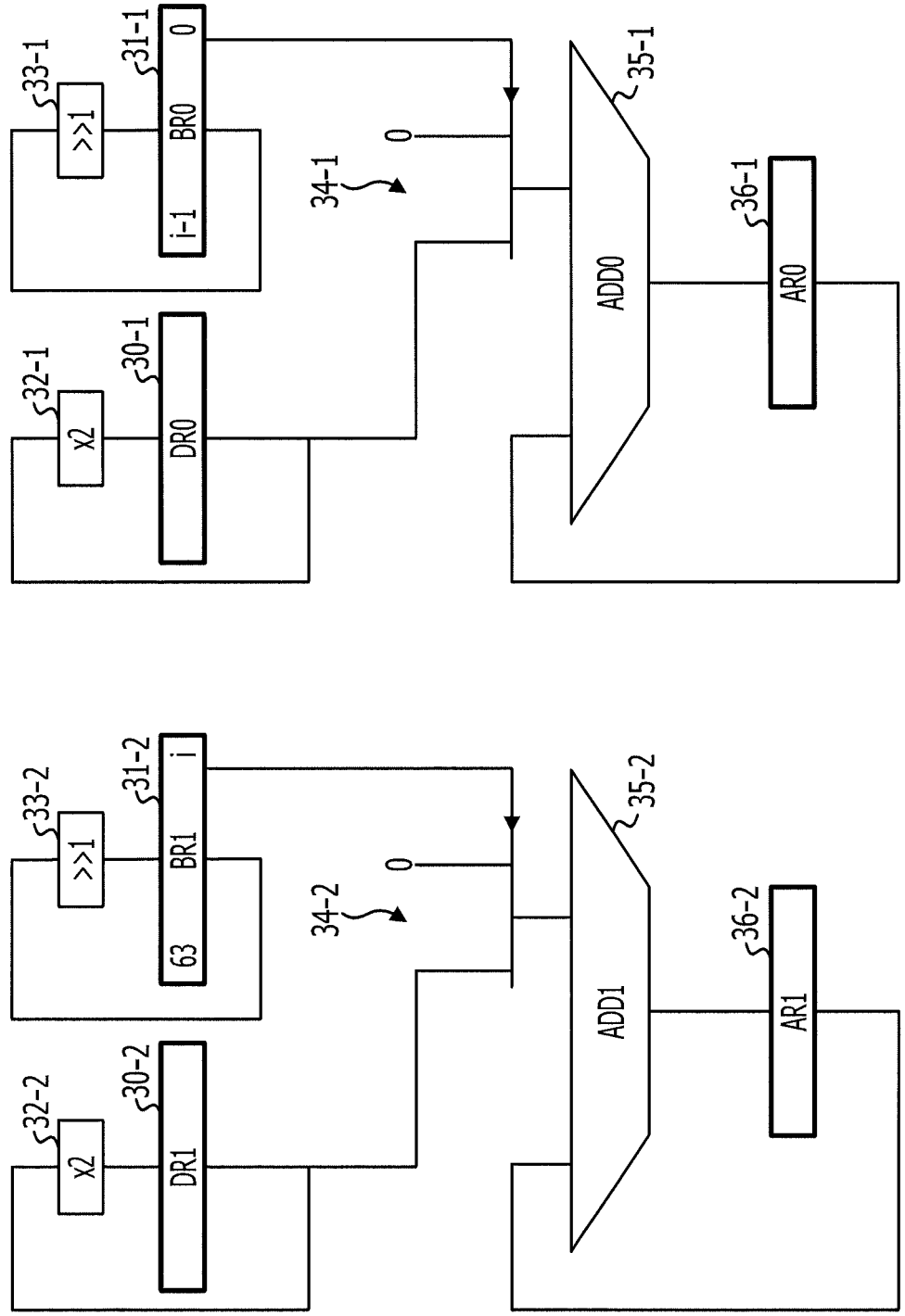
FIG. 5 illustrates an exemplary converter circuit.

FIG. 5 illustrates an exemplary converter circuit. In FIG. 5, two of the converter circuits each illustrated in FIG. 4 are used and a parallel process of two bits is performed. Elements illustrated in FIG. 5 which is substantially same as or similar to those illustrated in FIG. 4 is given the same reference numeral in FIG. 4, and its explanation may be omitted or reduced.

The converter circuit includes a data register (DR0) 30-1, a binary data register (BR0) 31-1, a multiple generator circuit 32-1, a bit shift circuit 33-1, a selector circuit 34-1, an adder circuit (ADD0) 35-1 and an accumulator register (AR0) 36-1. These circuits and registers convert lower i bits from 0th to (i−1)th bits of a binary number into a decimal number. The converter circuit includes a data register (DR1) 30-2, a binary data register (BR1) 31-2, a multiple generator circuit 32-2, a bit shift circuit 33-2, a selector circuit 34-2, an adder circuit (ADD1) 35-2 and an accumulator register (AR1) 36-2. These circuits and registers convert upper (63−(i−1)) bits from (i)th to 63rd bits of a binary number into a decimal number.

Functions and operations of the circuits and registers illustrated in FIG. 5 may be substantially the same as or similar to those of the corresponding circuits and registers illustrated in FIG. 4. As the converter which converts the upper (63−(i−1)) bits converts the upper bits from the (i)th bit to the most significant bit from binary to decimal, the data register 30-2 may be provided with an initial value $2^i$. The decimal number to be multiplied by a certain coefficient may be given an initial value two to power i (i is an integer not smaller than two).

A binary number is divided into an upper bit side and a lower bit side in the converter circuit illustrated in FIG. 5. The bits are each converted by the converter circuit illustrated in FIG. 4 in parallel. Two bits are processed in parallel by the use of the two converter circuits.

Figure 6:
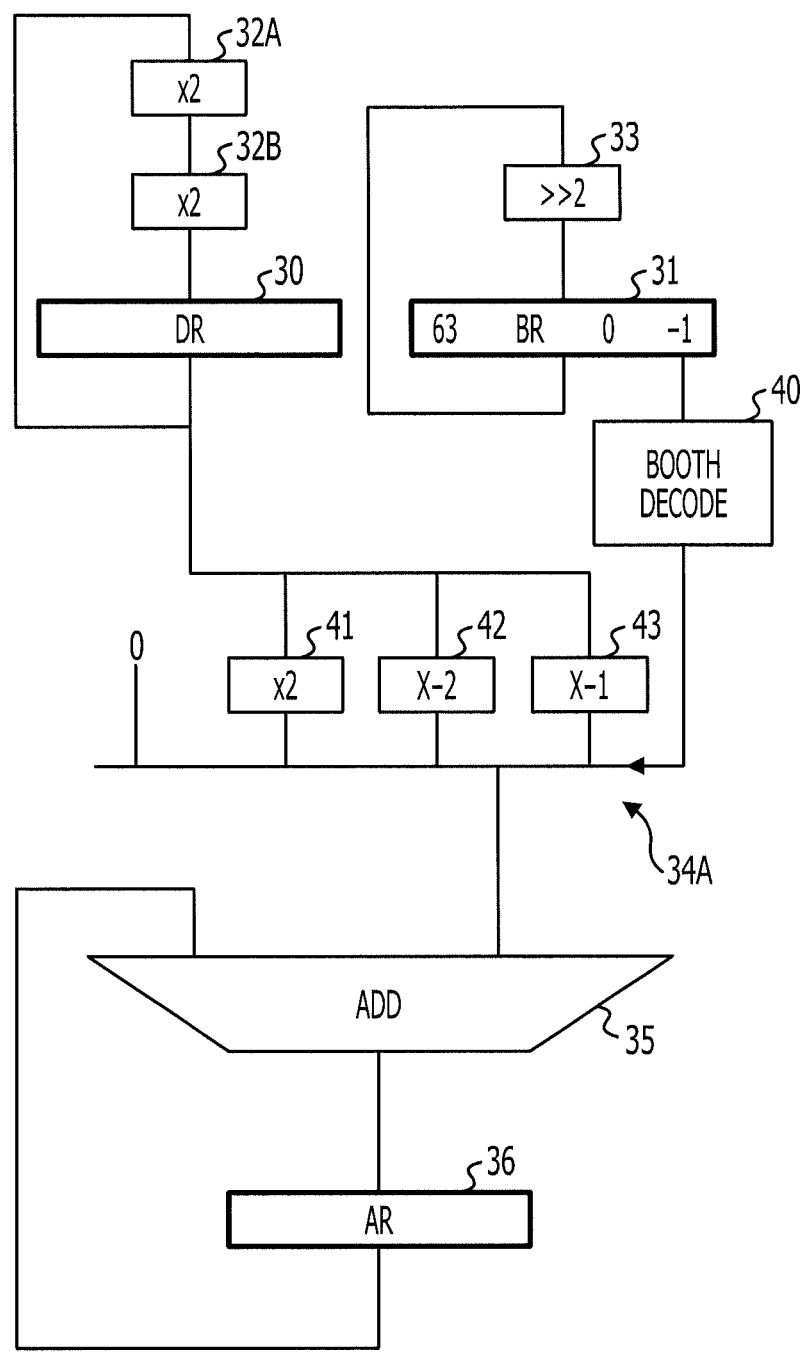
FIG. 6 illustrates an exemplary converter circuit.

FIG. 6 illustrates an exemplary converter circuit. In FIG. 6, a parallel process in units of two bits by the converter circuit illustrated in FIG. 4, for example, a parallel process where two bits are processed together in one cycle may be performed. Elements illustrated in FIG. 6 which is substantially the same as or similar to those illustrated in FIG. 4 is given the same reference numeral in FIG. 4, and its explanation may be omitted or reduced.

The converter circuit illustrated in FIG. 6 may include a selector circuit 34A instead of the selector circuit 34 illustrated in FIG. 4, and include multiple generator circuits 32A and 32B instead of the multiple generator circuit 32 illustrated in FIG. 4. The converter circuit illustrated in FIG. 6 may include a Booth decoder circuit 40.

A decimal number to be cyclically multiplied by a certain coefficient is stored in the data register 30. The multiple generator circuits 32A and 32B each performs a doubling operation. The multiple generator circuits 32A and 32B multiply an output of the data register 30 by the coefficient, e.g., quadruple (=double×double) the output and provides the data register 30 with a product of multiplication. The Booth decoder circuit 40 is provided with least significant three bits of a binary number to be converted in the binary data register 31. The Booth decoder circuit 40 provides the selector circuit 34A with a selection signal in three bits in accordance with the values of the provided three bits. The selector circuit 34A selects one of a plurality of, e.g., five decimal numbers including the decimal number to be cyclically multiplied by the coefficient and zero in accordance with a value of one or a plurality of, e.g., three bits extracted by the extractor circuit. For example, the selector circuit 34A outputs one of five decimal numbers in accordance with a value corresponding to the three bits from the Booth decoder circuit 40, e.g., the three bits extracted by the extractor circuit.

The selector circuit 34A receives decimal zero, the decimal number multiplied by the coefficient, a number twice the decimal number multiplied by the coefficient, a number (−2) times the decimal number multiplied by the coefficient and a number (−1) times the decimal number multiplied by the coefficient. An arithmetic operation subunit (×2) 41 calculates the number twice the decimal number multiplied by the coefficient supplied from the data register 30. An arithmetic operation subunit (x−2) 42 calculates the number (−2) times the decimal number multiplied by the coefficient provided by the data register 30. An arithmetic operation subunit (x−1) 43 calculates the number (−1) times the decimal number multiplied by the coefficient provided by the data register 30. The selector circuit 34A selects one of the plural decimal numbers based on a booth algorithm in accordance with values of a plurality of extracted bits.

Figure 7A:
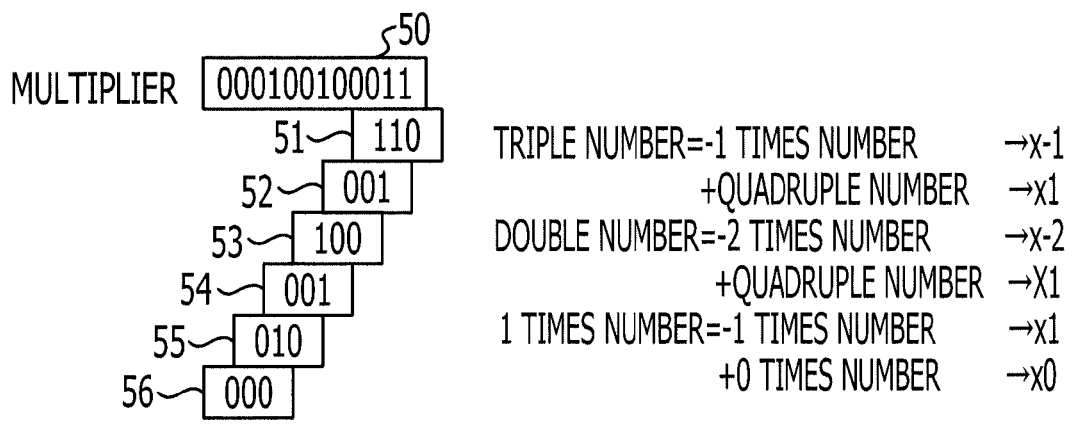
FIGS. 7A and 7B illustrate an exemplary Booth algorithm.
Figure 7B:

FIGS. 7A and 7B illustrate an exemplary Booth algorithm. The Booth algorithm may be a method for accelerating multiplication. If a multiplier is processed in multiplication of binary numbers bit by bit, the number obtained by multiply a multiplicand by one is added to an intermediate result and shift the intermediate result by one bit. If a multiplier is processed two bits by two bits for acceleration, a multiplicand to be added to four intermediate results is prepared. For example, numbers of zero times, one times, double and triple the multiplicand may be added correspondingly to multipliers of two bits 00, 01, 10 and 11, respectively. To multiply the multiplicand by zero, one and to double the multiplicand may be easily calculated. A circuit for multiplying the multiplicand by three may become complicated. A triple number may not be directly calculated and addition to an intermediate result of tripling is performed according to the Booth algorithm.

A triple number is calculated using a relationship, i.e., the triple number equals a quadruple number plus a number (−1) times the multiplicand according to the Booth algorithm. For example, in the addition of a triple number (−1) times a certain bit of the multiplier is added. As one times next two bits of the multiplier is a quadruple number as viewed from the previous two bits, one times the next two bits of the multiplier may be added. The (−1) times and quadruple numbers are added so that a triple number is added.

A multiple to be added on the next two bits themselves may exist in addition to a multiple for the previous two bits. If a bit lower than and next to the own bit is one, a multiple is prepared for the previous two bits. If a double number is added on the previous bit, the double number which equals the quadruple number plus the (−2) times number is calculated. A multiple based on the multiple for the previous two bits and the multiple for the own bit is selected based on the bit lower than and next to the own bit and the own two bits, for example, three bits in total, and the selected multiple is added to the intermediate result. A combination between a series of three bits to be referred to and the selected multiple is determined depending upon the triple number. Thus, the combinations are prepared as a table, and a combination of multiples for a three-bit input may be obtained based on the table.

The Booth algorithm may be applied to conversion from binary to decimal. A binary number 50 may be converted in FIG. 7A. A (−1) times number (x−1) is added to a three-bit value 51 obtained by adding a dummy bit "0" to least significant two bits "11" of the binary number 50 using a conversion table 57 illustrated in FIG. 7B. A one times number (×1) is added to a three-bit value 52 obtained by adding plus the lower adjacent bit "1" to next two bits "00" of the binary number 50 using the conversion table 57 illustrated in FIG. 7B. The (−1) times number and one times number are added to the least significant two bits and the next two bits, respectively. As the one times number of the next two bits is a quadruple number as viewed from the previous two bits, the (−1) times number and the quadruple number are added so that a triple number is added.

A (−2) times number (x−2) is added to a three-bit value 53 obtained by adding the lower adjacent bit "0" to next two bits "10" of the binary number 50 using the conversion table 57. A one times number (×1) is added a three-bit value 54 obtained by adding the lower adjacent bit "1" to next two bits "00" using the conversion table 57. The (−2) times number is added, and then the one times number is added. As the one times number is a quadruple number as viewed from the previous two bits, the (−2) times number and the quadruple number are added so that a double number is added as a result.

A one times number (×1) is added to a three-bit value 55 obtained by adding the lower adjacent bit "0" to next two bits "01" of the binary number 50 using the conversion table 57. A zero times number (×0) is added to a three-bit value 56 obtained by adding the lower adjacent bit "0" to next two bits "00" using the conversion table 57. The one times number and then the zero times number are added, and the one times number is resultantly added.

The Booth decoder circuit 40 illustrated in FIG. 6 may output a selection signal of three bits for selecting a multiple identified with reference, e.g., to the conversion table 57 illustrated in FIG. 7B in accordance with a three-bit value extracted from the binary data register 31. The selector circuit 34A selects a multiple to be properly added to a decimal sum in each cycle in which a binary number in the binary data register 31 is converted every two bits. A dummy bit "0" is appended to the least significant two bits of the binary number. Thus, the least significant bit of the binary data register 31 may indicate a (−1)th bit.

Figure 8:
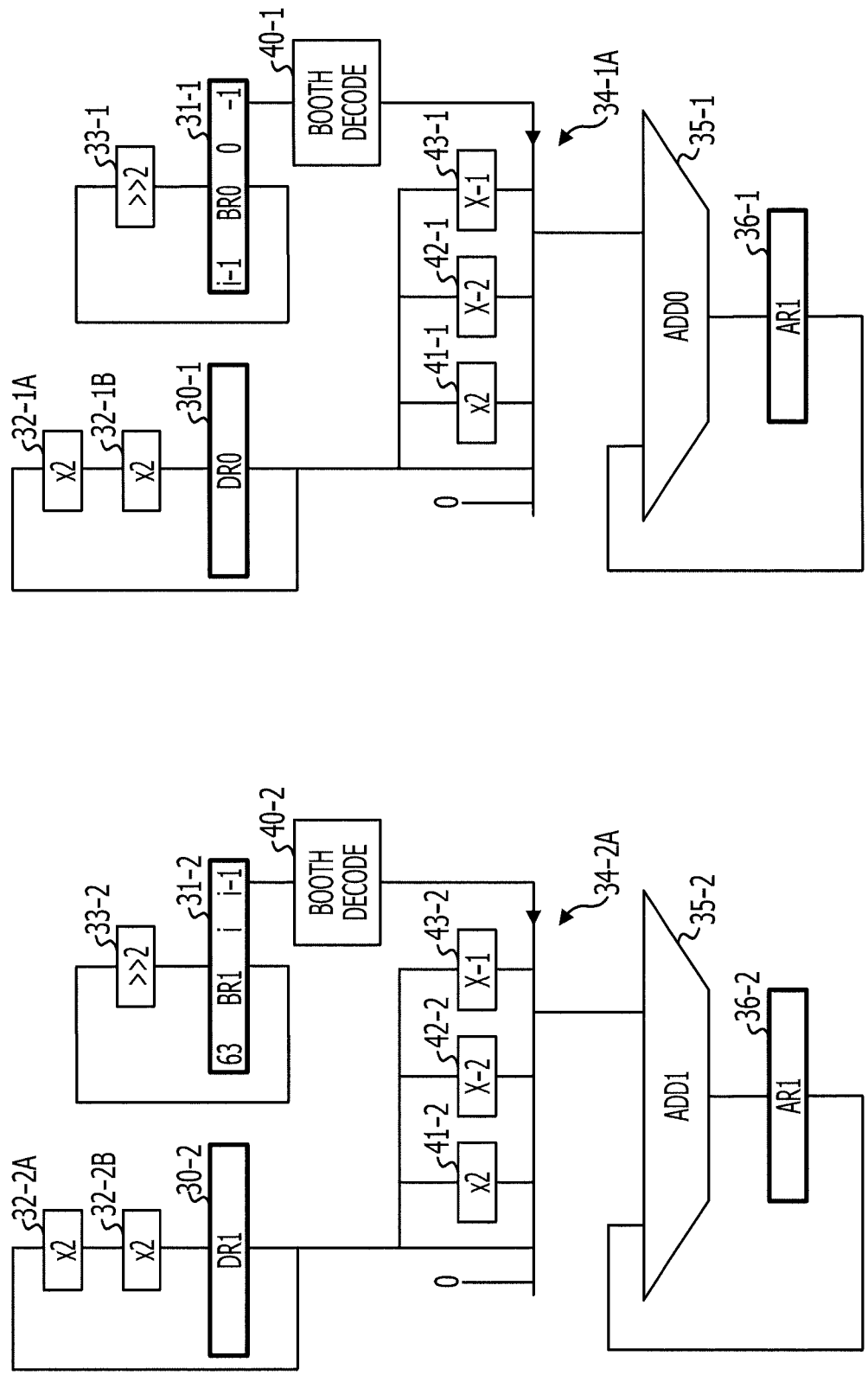
FIG. 8 illustrates an exemplary converter circuit.

FIG. 8 illustrates an exemplary converter circuit. Two of the converter circuits each illustrated in FIG. 6 are used and four bits may be processed in parallel in FIG. 8. Elements illustrated in FIG. 8 which is substantially the same as or similar to those illustrated in FIG. 6 is given the same reference numeral in FIG. 6, and its explanation may be omitted or reduced.

The converter circuit on the lower bit side includes a data register (DR0) 30-1, a binary data register (BR0) 31-1, multiple generator circuits 32-1A and 32-1B, a bit shift circuit 33-1 and a selector circuit 34-1A. The converter circuit on the lower bit side includes an adder circuit (ADD0) 35-1, an accumulator register (AR0) 36-1, a Booth decoder circuit 40-1 and arithmetic operation subunits 41-1 through 43-1. These circuits and registers convert lower i bits, for example, 0th to (i−1)th bits of a binary number into a decimal number. The converter circuit on the upper bit side includes a data register (DR1) 30-2, a binary data register (BR1) 31-2, multiple generator circuits 32-2A and 32-2B, a bit shift circuit 33-2 and a selector circuit 34-2A. The converter circuit on the upper bit side includes an adder circuit (ADD1) 35-2, an accumulator register (AR1) 36-2, a Booth decoder circuit 40-2 and arithmetic operation subunits 41-2 through 43-2. These circuits and registers convert upper (63−(i−1)) bits, for example, (i) th to 63rd bits of a binary number into a decimal number.

Functions and operations of the circuits and registers illustrated in FIG. 8 may be substantially the same as or similar to those of the corresponding circuits and registers illustrated in FIG. 6. As the converter which converts the upper (63−(i−1)) bits converts the upper bits from the (i)th bit to the most significant bit from binary to decimal, the data register 30-2 may be provided with an initial value $2^i$. The decimal number to be multiplied by a certain coefficient may be given, e.g., an initial value two to power i (i is an integer not smaller than two).

A binary number is divided into an upper bit side and a lower bit side in the converter circuit illustrated in FIG. 8. The upper and lower bits are processed in parallel by the converter circuits each illustrated in FIG. 6. As the two converter circuits processes two bits together in parallel, e.g., in one cycle, four bits are totally processed in parallel.

Figure 9:
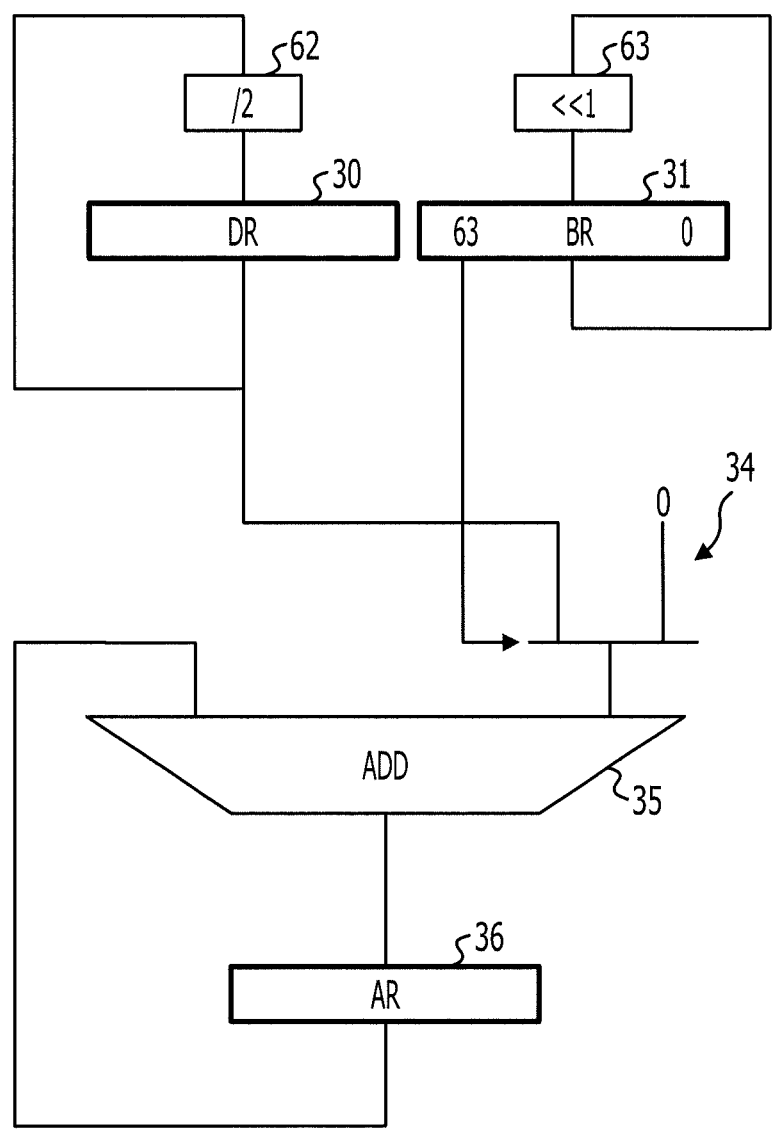
FIG. 9 illustrates an exemplary converter circuit.

FIG. 9 illustrates an exemplary converter circuit. Elements illustrated in FIG. 9 which is substantially the same as or similar to those illustrated in FIG. 4 is given the same reference numeral in FIG. 4, and its explanation may be omitted or reduced. The multiple generator circuit 32 and the bit shift circuit 33 illustrated in FIG. 4 may be replaced with a half multiple generator circuit 62 and a bit shift circuit 63, respectively, in FIG. 9.

The bit shift circuit 63 may shift a binary number in the binary data register 31, e.g., left, or right. A signal line extended from the binary data register 31 to the selector circuit 34 carries one or a plurality of consecutive bits, for example, one bit from the most or least significant bit of data, for example, the most significant bit of data in the binary data register 31. The extractor circuit extracts one or a plurality of consecutive bits, for example, one bit from the most or least significant bit of the binary number, for example, the most significant bit of the binary number in the binary data register 31 in order.

A decimal number to be cyclically multiplied by a certain coefficient is stored in the data register 30. If the binary data register 31 which stores a binary number has a width of 64 bits, the decimal number in the data register 30 may be provided with an initial value $2^{63}$. The half multiple generator circuit 62 multiplies an output of the data register 30 by a certain coefficient, e.g., a half, and provides the data register 30 with a product of the multiplication. The selector circuit 34 selects one of zero and the number to be multiplied by the coefficient from the data register 30 in accordance with a value of one or a plurality of bits, for example, one bit extracted by the extractor circuit.

A decimal number output by the selector circuit 34 in each cycle may correspond to a value of a decimal number obtained by converting an extracted bit of a binary number in the binary data register 31. Every bit starting from the most significant bit of the binary number in the binary data register 31 is consecutively converted into a decimal number and is added to the decimal sum in the accumulator register 36. If all the bits of the binary number in the binary data register 31 are extracted and the specific operation is completed, a decimal number obtained by converting the binary number may be obtained from the accumulator register 36.

Figure 10:
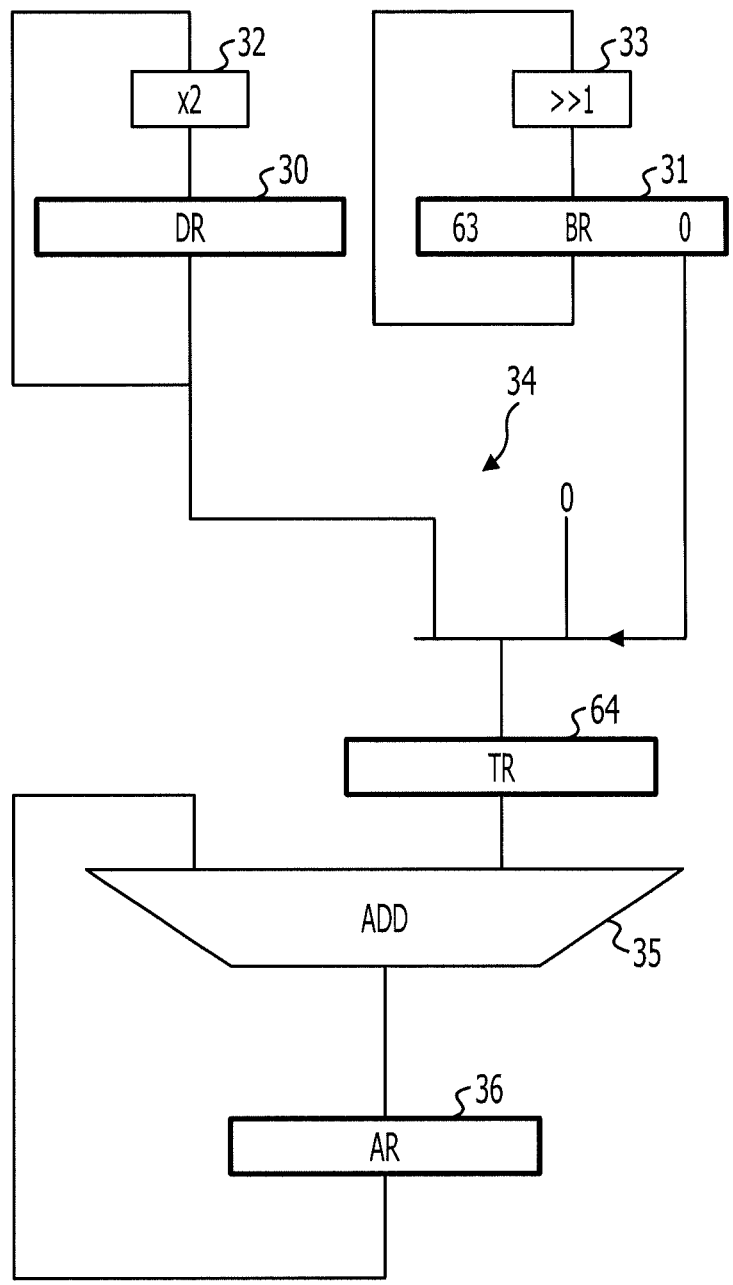
FIG. 10 illustrates an exemplary converter circuit.

FIG. 10 illustrates an exemplary converter circuit. Elements illustrated in FIG. 10 which is substantially the same as or similar to those illustrated in FIG. 4 is given the same reference numeral in FIG. 4, and its explanation may be omitted or reduced. A pipeline register 64 may be provided between the selector circuit 34 and the adder circuit 35 in FIG. 10.

The critical path illustrated in FIG. 4 may be a path from the output of the data register 30 via the selector circuit 34 and the adder circuit 35 to the input of the accumulator register 36. The pipeline register 64 may be inserted between the selector circuit 34 and the adder circuit 35 in FIG. 4 so that the paths of the selector circuit 34 and the adder circuit 35 are separate from each other in terms of timing.

The pipeline register 64 takes in data from the selector circuit 34 in one cycle. The accumulator register 36 which stores a resultant sum and the pipeline register 64 which stores data to be input to the adder circuit 35 may be updated substantially contemporaneously Latency for an update of the pipeline register 64 may be hidden in the second and following cycles. The critical path may be improved in exchange for an increase in arithmetic operation latency in one cycle.

Figure 11:
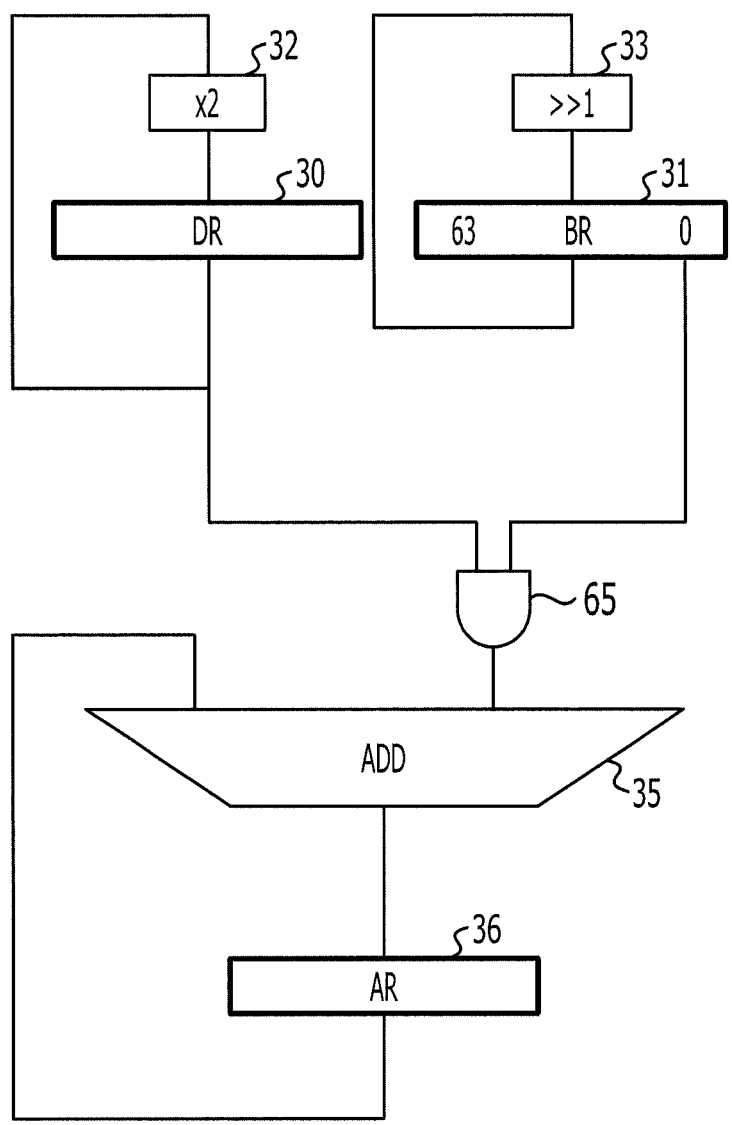
FIG. 11 illustrates an exemplary converter circuit.

FIG. 11 illustrates an exemplary converter circuit. Elements illustrated in FIG. 11 which is substantially the same as or similar to those illustrated in FIG. 4 is given the same reference numeral in FIG. 4, and its explanation may be omitted or reduced. The selector circuit 34 is replaced with an AND circuit 65 in FIG. 11. The AND circuit 65 may be provided for each bit of data from the data register 30.

If a bit extracted from the binary data register 31 indicates 1, the AND circuit 65 provides the adder circuit 35 with a decimal number to be cyclically multiplied by a certain coefficient from the data register 30. If the bit extracted from the binary data register 31 indicates 0, the AND circuit 65 provides the adder circuit 35 with a data value 0.

The adder circuit 35 and the accumulator register 36 may correspond to an update circuit similarly as in the converter circuit illustrated in FIG. 4. The update circuit updates the decimal sum in the accumulator register 36 with the number obtained by adding the decimal number to be cyclically multiplied by the coefficient added to the decimal sum if one or a plurality of extracted bits, for example, one extracted bit indicates a specific value, for example, one. For example, If the extracted bit indicates "1" and "0", the adder circuit 35 adds the decimal number to be cyclically doubled and zero, respectively, to the decimal sum.

The AND circuit 65 may be used instead of the selector circuit 34, and the process when using the selector circuit 34 may be performed.

Figure 12:
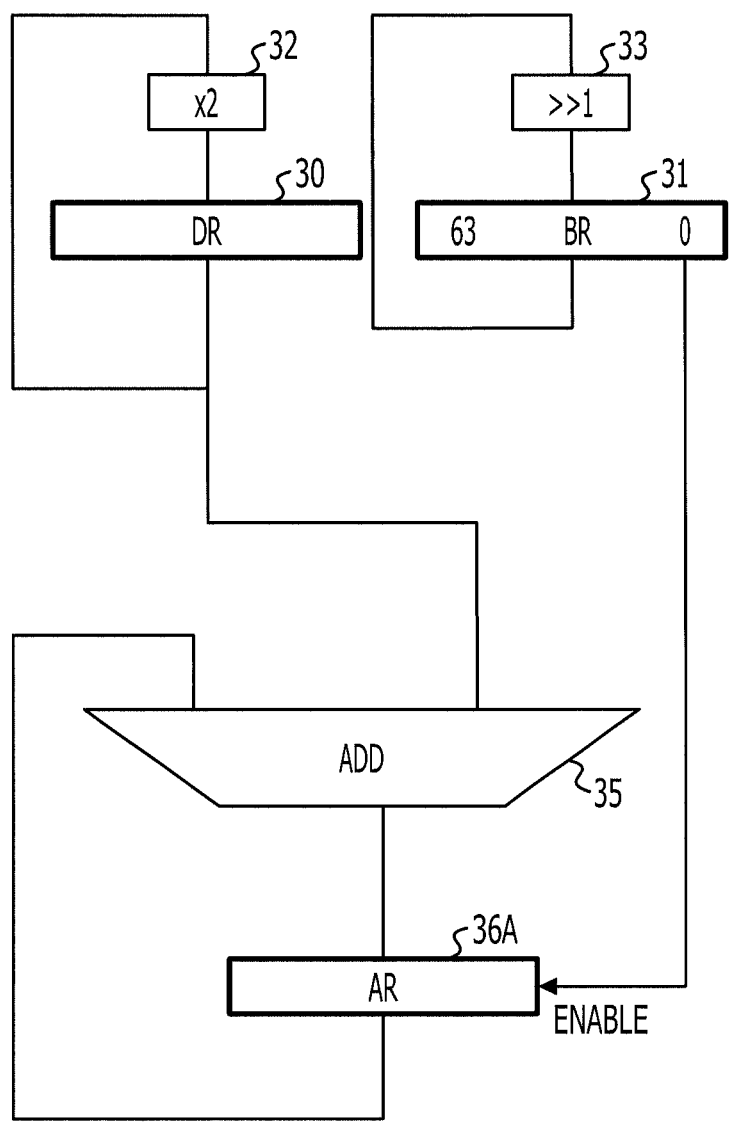
FIG. 12 illustrates an exemplary converter circuit.

FIG. 12 illustrates an exemplary converter circuit. Elements illustrated in FIG. 12 which is substantially the same as or similar to those illustrated in FIG. 4 is given the same reference numeral in FIG. 4, and its explanation may be omitted or reduced. In FIG. 12, one bit extracted from the binary data register 31 instead of the selector circuit 34 is supplied to an accumulator register 36A as an enabling signal.

The adder circuit 35 and the accumulator register 36A may correspond to an update circuit similarly as in the converter circuit illustrated in FIG. 4. The update circuit updates the decimal sum in the accumulator register 36A with the number obtained by adding the decimal number to be cyclically multiplied by the coefficient added to the decimal sum if one or a plurality of extracted bits, for example, one extracted bit indicates a specific value, e.g., one. For example, if the extracted bit indicates "1", the accumulator register 36A receiving an enabling signal "1" carries out a writing operation, and a sum of the decimal number to be cyclically doubled and the decimal sum is stored in the accumulator register 36A. If the extracted bit indicates "0", the accumulator register 36A receiving an enabling signal "0" may not perform the writing operation, and a sum of the decimal number to be cyclically doubled and the decimal sum may not be stored in the accumulator register 36A.

The enabling signal for the accumulator register 36A may be used instead of the selector circuit 34, and the process when the selector circuit 34 is used may be carried out.

Figure 13:
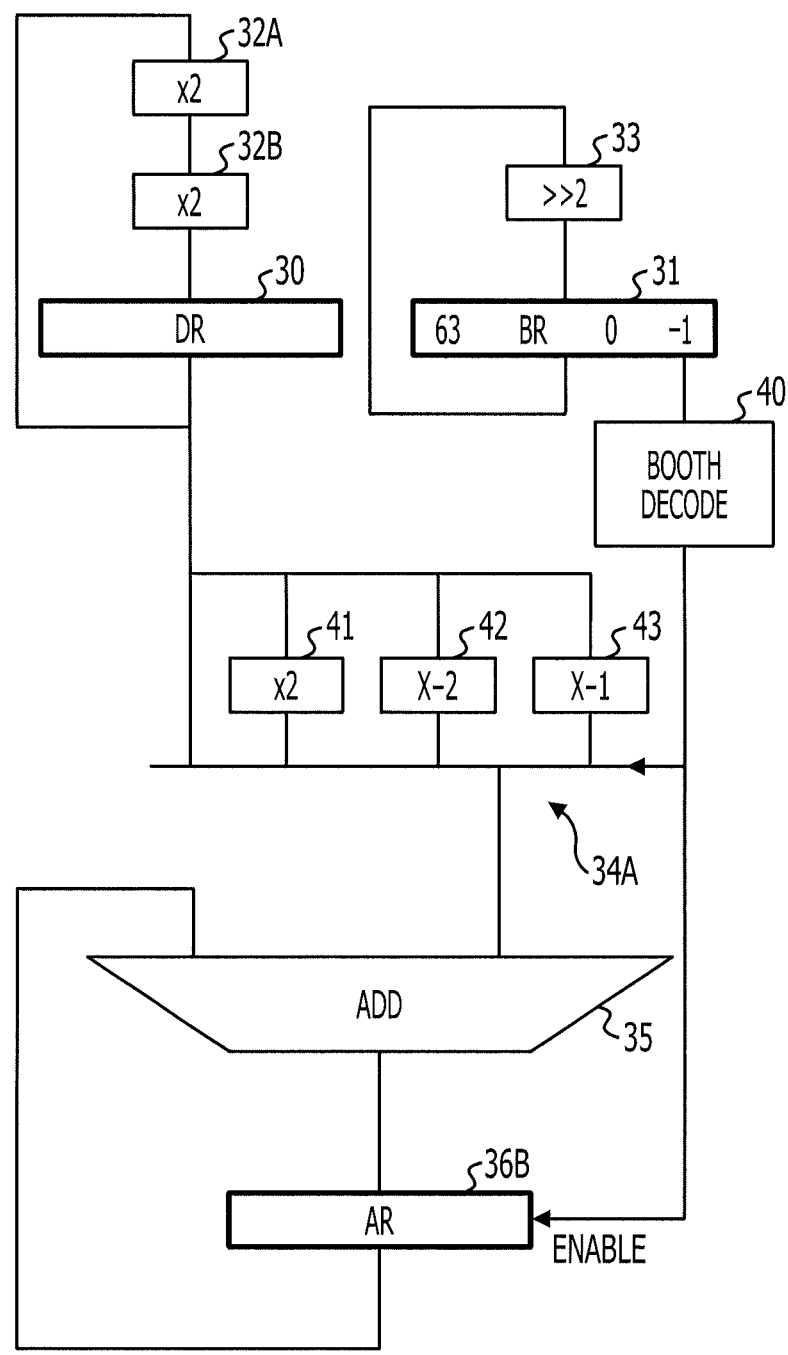
FIG. 13 illustrates an exemplary converter circuit.

FIG. 13 illustrates an exemplary converter circuit. Elements Each of components illustrated in FIG. 13 which is substantially the same as or similar to those illustrated in FIG. 6 is given the same reference numeral in FIG. 6, and its explanation may be omitted or reduced. The selector circuit 34A is replaced with a selector circuit 34B, and the Booth decoder circuit 40 provides an accumulator register 36B with an output signal of the Booth decoder circuit 40 as an enabling signal in FIG. 13.

If the selector circuit 34A is provided with a signal which makes the Booth decoder circuit 40 select a value multiplied by "0", e.g., zero in FIG. 6, the value in the accumulator register 36 is updated with substantially the same value. For example, if the selector circuit 34A selects "0" and the accumulator register 36 carries out no writing operation, an operation which is substantially the same as that of the converter circuit illustrated in FIG. 6 may be carried out. If a signal which makes the Booth decoder circuit 40 select a value multiplied by "0", e.g., zero, is output in the converter circuit illustrated in FIG. 13, the accumulator register 36B may not perform the writing operation. As the selector circuit 34B does not select "0", the selector circuit 34B may be provided with four decimal values among the five decimal values other than "0" illustrated in FIG. 6.

Figure 14:
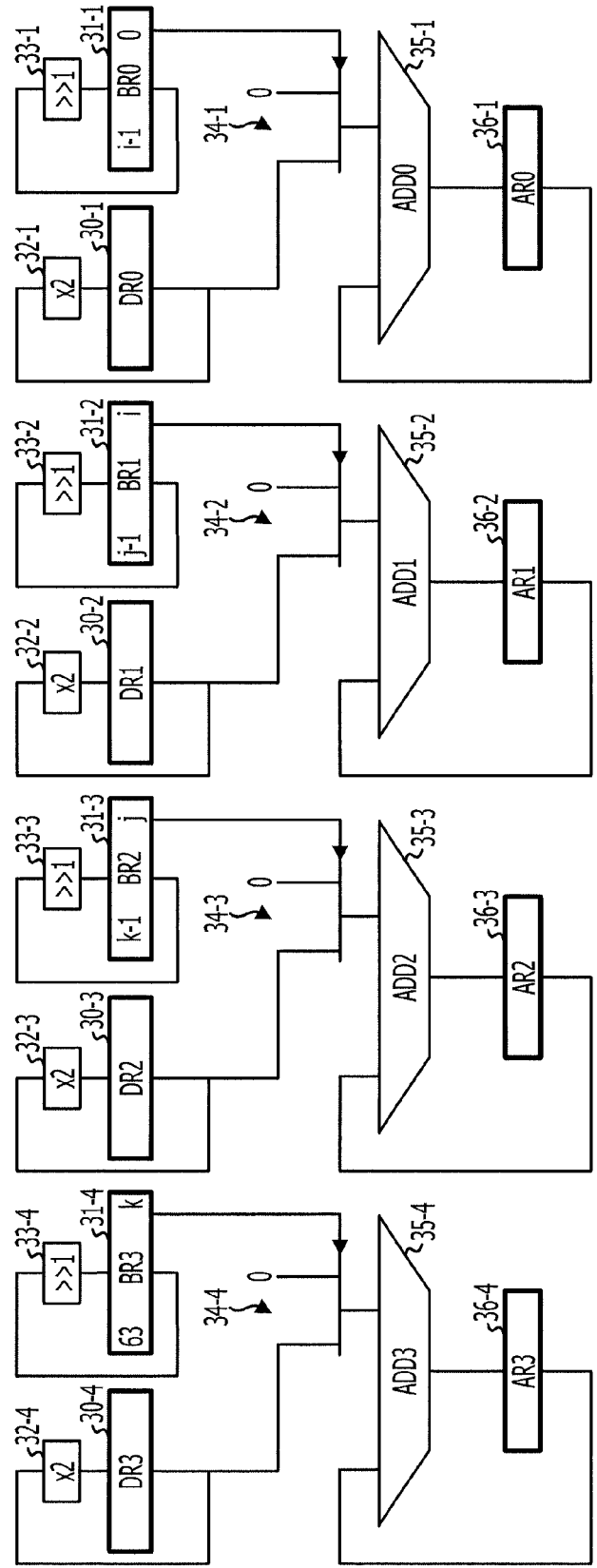
FIG. 14 illustrates an exemplary converter circuit.

FIG. 14 illustrates an exemplary converter circuit. Four of the converter circuits each illustrated in FIG. 4 are used and four bits are processed in parallel. Elements illustrated in FIG. 14 which is substantially the same as or similar to those illustrated in FIG. 4 is given the same reference numeral in FIG. 4, and its explanation may be omitted or reduced.

The converter circuit includes a data register (DR0) 30-1, a binary data register (BR0) 31-1, a multiple generator circuit 32-1, a bit shift circuit 33-1, a selector circuit 34-1, an adder circuit (ADD0) 35-1 and an accumulator register (AR0) 36-1. These circuits and registers convert lower i bits, for example, 0th to (i−1)th bits of a binary number into a decimal number. The converter circuit includes a data register (DR1) 30-2, a binary data register (BR1) 31-2, a multiple generator circuit 32-2, a bit shift circuit 33-2, a selector circuit 34-2, an adder circuit (ADD1) 35-2 and an accumulator register (AR1) 36-2. These circuits and registers convert (i)th to (j−1)th bits of a binary number into a decimal number.

The converter circuit includes a data register (DR2) 30-3, a binary data register (BR2) 31-3, a multiple generator circuit 32-3, a bit shift circuit 33-3, a selector circuit 34-3, an adder circuit (ADD2) 35-3 and an accumulator register (AR2) 36-3. These circuits and registers convert (j) th to (k−1)th bits of a binary number into a decimal number. The converter circuit includes a data register (DR3) 30-4, a binary data register (BR3) 31-4, a multiple generator circuit 32-4, a bit shift circuit 33-4, a selector circuit 34-4, an adder circuit (ADD3) 35-4 and an accumulator register (AR3) 36-4. These circuits and registers convert upper (63-(k−1)) bits, i.e., (k)th to (j−1) th bits of a binary number into a decimal number.

Functions and operations of the circuits and registers illustrated in FIG. 14 may be substantially the same as or similar to those of the corresponding circuits and registers illustrated in FIG. 4. Initial values for the data registers 30-1 through 30-4 may be properly set. For example, an initial value of a decimal number to be multiplied by a certain coefficient may be power-of-two value according to a corresponding bit position.

A binary number is divided by four and the quotients may be each processed by the converter circuit illustrated in FIG. 4 in parallel. Data of four bits is processed in parallel by the use of four sets of the converter circuit.

Figure 15:
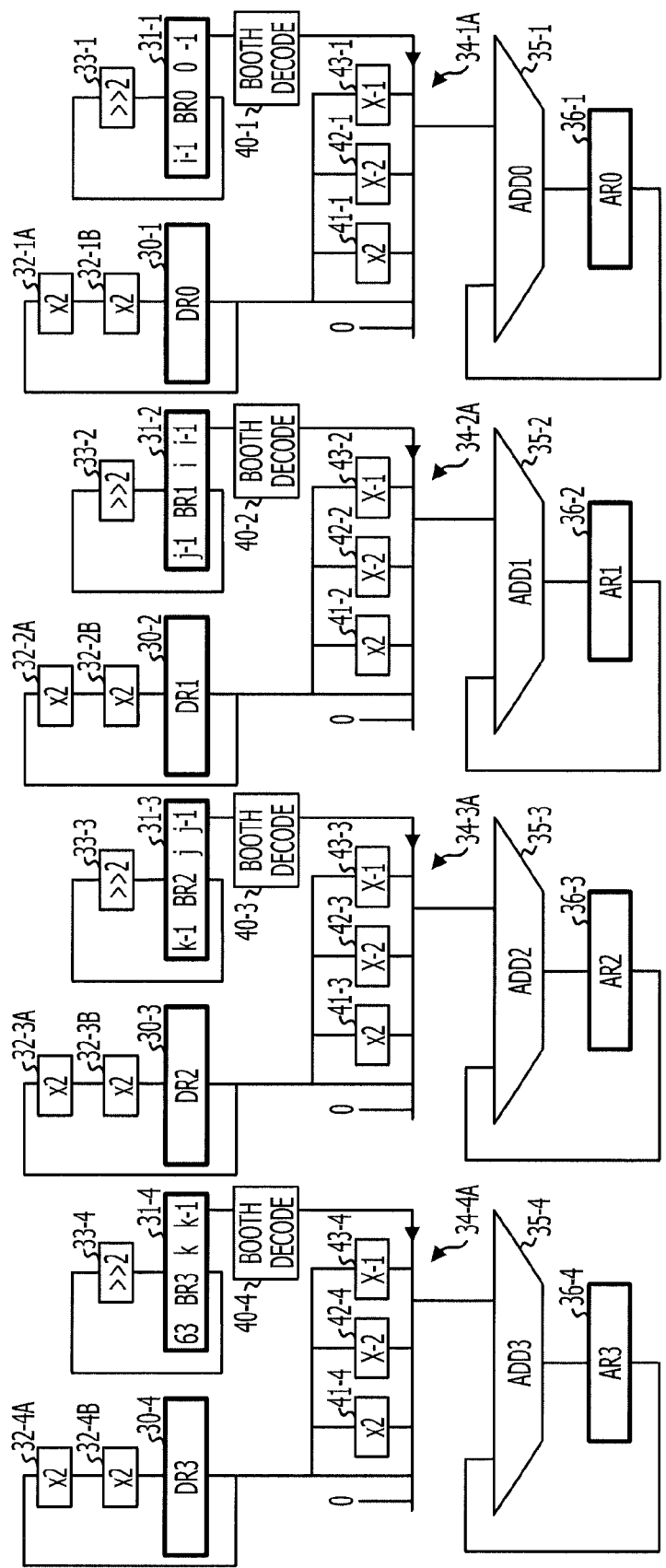
FIG. 15 illustrates an exemplary converter circuit.

FIG. 15 illustrates an exemplary converter circuit. Four of the converter circuits each illustrated in FIG. 6 are used and eight bits are processed in parallel. Elements illustrated in FIG. 15 which is substantially the same as or similar to those illustrated in FIG. 6 is given the same reference numeral in FIG. 6, and its explanation may be omitted or reduced.

The converter circuit includes a data register (DR0) 30-1, a binary data register (BR0) 31-1, multiple generator circuits 32-1A and 32-1B, a bit shift circuit 33-1 and a selector circuit 34-1A. The converter circuit includes an adder circuit (ADD0) 35-1, an accumulator register (AR0) 36-1, a Booth decoder circuit 40-1 and arithmetic operation subunits 41-1 through 43-1. These circuits and registers convert lower i bits, for example, 0th to (i−1)th bits of a binary number into a decimal number. The converter circuit includes a data register (DR1) 30-2, a binary data register (BR1) 31-2, multiple generator circuits 32-2A and 32-2B, a bit shift circuit 33-2 and a selector circuit 34-2A. The converter circuit includes an adder circuit (ADD1) 35-2, an accumulator register (AR1) 36-2, a Booth decoder circuit 40-2 and arithmetic operation subunits 41-2 through 43-2. These circuits and registers convert upper (i)th to (j−1)th bits of a binary number into a decimal number.

The converter circuit includes a data register (DR2) 30-3, a binary data register (BR2) 31-3, multiple generator circuits 32-3A and 32-3B, a bit shift circuit 33-3 and a selector circuit 34-3A. The converter circuit includes an adder circuit (ADD2) 35-3, an accumulator register (AR2) 36-3, a Booth decoder circuit 40-3 and arithmetic operation subunits 41-3 through 43-3. These circuits and registers convert (j) th to (k−1)th bits of a binary number into a decimal number. The converter circuit includes a data register (DR3) 30-4, a binary data register (BR3) 31-4, multiple generator circuits 32-4A and 32-4B, a bit shift circuit 33-4 and a selector circuit 34-4A. The converter circuit includes an adder circuit (ADD3) 35-4, an accumulator register (AR3) 36-4, a Booth decoder circuit 40-4 and arithmetic operation subunits 41-4 through 43-4. These circuits and registers convert upper (k)th to (63-(k−1)) th bits of a binary number into a decimal number.

Functions and operations of the circuits and registers illustrated in FIG. 15 may be substantially the same as those of the corresponding circuits and registers illustrated in FIG. 6 or FIG. 8. Initial value of the data registers 30-1 through 30-4 may be each properly set. For example, an initial value of a decimal number to be multiplied by a certain coefficient may be power-of-two value according to a corresponding bit position.

A binary number is divided by four and the quotient binary numbers may be each processed by the converter circuit illustrated in FIG. 6 in parallel. Data of eight bits is processed in parallel using the four converter circuits.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An arithmetic operation circuit comprising:
    an extractor circuit that extracts one or a plurality of bits from a most significant bit or from a least significant bit of a binary number;
    a sum register that stores an X-adic sum, where X is an integer more than two; and
    an update circuit that updates the X-adic sum in the sum register with a value obtained by adding a first X-adic number, which is stored in a data register and is to be cyclically multiplied by a coefficient by a multiple generator circuit, to the X-adic sum in the sum register in accordance with the extracted one or plurality of bits.

2. The arithmetic operation circuit according to claim 1, wherein the coefficient is more than one when the extractor circuit that extracts the one or plurality of bits from the least significant bit of the binary number, and the coefficient is less than one when the extractor circuit that extracts the one or plurality of bits from the most significant bit of the binary number.

3. The arithmetic operation circuit according to claim 1, further comprising,
    a selector circuit that selects one value of a plurality of second X-adic numbers including the first X-adic number and a specific value in accordance with the extracted one or plurality of bits,
    wherein the update circuit updates the X-adic sum in the sum register by adding the one value to the X-adic sum in the sum register.

4. The arithmetic operation circuit according to claim 2, wherein the specific value is zero.

5. The arithmetic operation circuit according to claim 3, wherein the extracted one or plurality of bits is the extracted plurality of bits, and the selector circuit selects one of the plurality of second X-adic numbers in accordance with the extracted plurality of bits based on a booth algorithm.

6. The arithmetic operation circuit according to claim 5, wherein a bit width of the extracted plurality of bits is three, and the plurality of second X-adic include zero, the first X-adic number, double the first X-adic number, the first X-adic number multiplied by (−2) and the first X-adic number multiplied by (−1).

7. The arithmetic operation circuit according to claim 1, wherein the multiple generator circuit multiplies an output of the data register by the coefficient and supplies the multiplied output to the data register.

8. The arithmetic operation circuit according to claim 1, wherein the extractor circuit further includes:
    a binary number register that stores the binary number;
    a shift circuit that shifts the stored binary number; and
    a signal line that transfers the one or plurality of bits from the most significant bit or least significant bit in the binary number register.

9. The arithmetic operation circuit according to claim 1, wherein an initial value of the first X-adic number is $2^i$, where i is an integer more than one.

10. A method of converting a binary number, the method comprising:
    extracting one or a plurality of bits from a most significant bit or from a least significant bit of a binary number;
    adding, by an adder, a first X-adic number, which is stored in a data register and is to be cyclically multiplied by a coefficient by a multiple generator circuit, to a X-adic sum in a sum register in accordance with the extracted one or plurality of bits, where X is an integer more than two; and
    updating the X-adic sum in the sum register with a value obtained by the adding.

11. The method according to claim 10, wherein the coefficient is more than one when extracting the one or plurality of bits from the least significant bit of the binary number, and the coefficient is less than one when extracting the one or plurality of bits from the most significant bit of the binary number.

12. The method according to claim 10, wherein an initial value of the first X-adic number is $2^i$, where i is an integer more than one.

13. The method according to claim 10, further comprising:
    selecting one value of a plurality of second X-adic numbers including the first X-adic number and a specific value by a selector circuit in accordance with the extracted one or plurality of bits; and
    adding the one value to the X-adic sum in the sum register so as to update the X-adic sum in the sum register.

14. The method according to claim 13, wherein the specific value is zero.

15. The method according to claim 13, wherein the extracted one or plurality of bits is the extracted plurality of bits, and the selector circuit selects one of the plurality of second X-adic numbers in accordance with the extracted plurality of bits based on a booth algorithm.

* * * * *

UNITED STATES PATENT AND TRADEMARK OFFICE
CERTIFICATE OF CORRECTION

| | |
|---|---|
| PATENT NO. | : 8,892,615 B2 |
| APPLICATION NO. | : 13/410652 |
| DATED | : November 18, 2014 |
| INVENTOR(S) | : Kenichi Kitamura |

Page 1 of 1

It is certified that error appears in the above-identified patent and that said Letters Patent is hereby corrected as shown below:

In the Claims

Column 13, line 36, In Claim 4, delete "claim 2," and insert -- claim 3, --, therefor.

Signed and Sealed this
Fifth Day of May, 2015

Michelle K. Lee
*Director of the United States Patent and Trademark Office*